US012581968B2

(12) United States Patent  
Elsherbini et al.

(10) Patent No.: US 12,581,968 B2  
(45) Date of Patent: Mar. 17, 2026

(54) PACKAGE ARCHITECTURE OF LARGE DIES USING QUASI-MONOLITHIC CHIP LAYERS

(71) Applicant: Intel Corporation, Santa Clara, CA (US)

(72) Inventors: Adel A. Elsherbini, Chandler, AZ (US); Scott E. Siers, Alma, AR (US); Gerald S. Pasdast, San Jose, CA (US); Johanna M. Swan, Scottsdale, AZ (US); Henning Braunisch, Phoenix, AZ (US); Kimin Jun, Portland, OR (US); Jiraporn Seangatith, Chandler, AZ (US); Shawna M. Liff, Scottsdale, AZ (US); Mohammad Enamul Kabir, Portland, OR (US); Sathya Narasimman Tiagaraj, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 567 days.

(21) Appl. No.: 17/820,993

(22) Filed: Aug. 19, 2022

(65) Prior Publication Data

US 2024/0063132 A1 Feb. 22, 2024

(51) Int. Cl.
| | |
|---|---|
| *H01L 23/538* | (2006.01) |
| *H01L 23/00* | (2006.01) |
| *H01L 25/065* | (2023.01) |

(52) U.S. Cl.
CPC ...... *H01L 23/5386* (2013.01); *H01L 23/5383* (2013.01); *H01L 24/05* (2013.01);
(Continued)

(58) Field of Classification Search
CPC ......... H01L 24/05; H01L 24/08; H01L 24/80; H01L 25/0652; H01L 25/0657;
(Continued)

(56) References Cited

U.S. PATENT DOCUMENTS 10,825,779 B2 * 11/2020 Or-Bach ................. H01L 24/94
10,916,514 B2 * 2/2021 Kim ................... H01L 23/49827
(Continued)

OTHER PUBLICATIONS

U.S. Appl. No. 17/891,530, filed Aug. 19, 2022, Adel A. Elsherbini.
(Continued)

*Primary Examiner* — Mamadou L Diallo
(74) *Attorney, Agent, or Firm* — Akona IP PC

(57) ABSTRACT

Embodiments of a microelectronic assembly comprise: a plurality of layers of IC dies, adjacent layers in the plurality of layers being coupled together by first interconnects and a package substrate coupled to the plurality of layers by second interconnects. A first layer in the plurality of layers comprises a dielectric material surrounding a first IC die in the first layer, a second layer in the plurality of layers is adjacent and non-coplanar with the first layer, the second layer comprises a first circuit region and a second circuit region separated by a third circuit region, the first circuit region and the second circuit region are bounded by respective guard rings, and the first IC die comprises conductive pathways conductively coupling conductive traces in the first circuit region with conductive traces in the second circuit region.

20 Claims, 7 Drawing Sheets

(52) U.S. Cl.
CPC .............. *H01L 24/08* (2013.01); *H01L 24/16* (2013.01); *H01L 24/80* (2013.01); *H01L 25/0652* (2013.01); *H01L 25/0657* (2013.01); *H01L 2224/05647* (2013.01); *H01L 2224/05687* (2013.01); *H01L 2224/08121* (2013.01); *H01L 2224/08145* (2013.01); *H01L 2224/16225* (2013.01); *H01L 2224/80895* (2013.01); *H01L 2224/80896* (2013.01); *H01L 2225/06524* (2013.01); *H01L 2225/06541* (2013.01); *H01L 2924/3512* (2013.01); *H01L 2924/37001* (2013.01); *H01L 2924/3841* (2013.01)

(58) Field of Classification Search
CPC . H01L 2224/08145; H01L 2224/16225; H01L 2224/80895; H01L 2224/80896; H01L 23/5386; H01L 23/5383; H01L 24/16; H01L 2224/05647; H01L 2224/05687; H01L 24/13; H01L 2225/06548; H01L 23/5385; H01L 23/585; H01L 24/17; H01L 25/18; H01L 25/50
See application file for complete search history.

(56) References Cited

U.S. PATENT DOCUMENTS

| | | | |
|---|---|---|---|
| 2012/0211885 A1 | | 8/2012 | Choi et al. |
| 2015/0179558 A1 | | 6/2015 | Kim |
| 2017/0207197 A1 | | 7/2017 | Yu et al. |
| 2018/0108603 A1 | * | 4/2018 | Machida ........... H01L 23/49816 |
| 2019/0385977 A1 | | 12/2019 | Elsherbini et al. |
| 2020/0006324 A1 | * | 1/2020 | Chen ...................... H01L 24/09 |
| 2020/0091128 A1 | * | 3/2020 | Elsherbini ........... H01L 23/5386 |
| 2020/0212020 A1 | | 7/2020 | Zhang et al. |
| 2022/0051987 A1 | * | 2/2022 | Elsherbini ........... H01L 23/5386 |
| 2022/0302184 A1 | * | 9/2022 | Finkelstein ........... H10F 39/811 |
| 2023/0187386 A1 | * | 6/2023 | Pietambaram ...... H01L 23/5385 257/531 |
| 2023/0378132 A1 | * | 11/2023 | Shen ................. H01L 21/76895 |
| 2024/0030152 A1 | | 1/2024 | Lin et al. |
| 2025/0006704 A1 | | 1/2025 | Zhou et al. |
| 2025/0087632 A1 | | 3/2025 | Chou et al. |
| 2025/0226292 A1 | | 7/2025 | Yang et al. |

OTHER PUBLICATIONS

U.S. Appl. No. 17/891,536, filed Aug. 19, 2022, Adel A. Elsherbini.
U.S. Appl. No. 17/891,560, filed Aug. 19, 2022, Adel A. Elsherbini.
U.S. Appl. No. 17/891,654, filed Aug. 19, 2022, Adel A. Elsherbini.
U.S. Appl. No. 17/891,666, filed Aug. 19, 2022, Adel A. Elsherbini.
U.S. Appl. No. 17/891,690, filed Aug. 19, 2022, Adel A. Elsherbini.
U.S. Appl. No. 17/891,704, filed Aug. 19, 2022, Adel A. Elsherbini.
U.S. Appl. No. 17/891,727, filed Aug. 19, 2022, Adel A. Elsherbini.
U.S. Appl. No. 17/891,735, filed Aug. 19, 2022, Adel A. Elsherbini.
U.S. Appl. No. 17/891,738, filed Aug. 22, 2019, Adel A. Elsherbini.
U.S. Appl. No. 17/891,880, filed Aug. 19, 2022, Adel A. Elsherbini.
U.S. Appl. No. 17/891,654, filed Aug. 19, 2022.
U.S. Appl. No. 17/891,880, filed Aug. 19, 2022.
U.S. Appl. No. 17/891,530, filed Aug. 19, 2022.
U.S. Appl. No. 17/891,536, filed Aug. 19, 2022.
U.S. Appl. No. 17/891,704, filed Aug. 19, 2022.
U.S. Appl. No. 17/891,727, filed Aug. 19, 2022.
U.S. Appl. No. 17/891,735, filed Aug. 19, 2022.
U.S. Appl. No. 17/891,666, filed Aug. 19, 2022.
U.S. Appl. No. 17/891,690, filed Aug. 19, 2022.
U.S. Appl. No. 17/891,738, filed Aug. 19, 2022.
U.S. Appl. No. 17/891,560, filed Aug. 19, 2022.

* cited by examiner

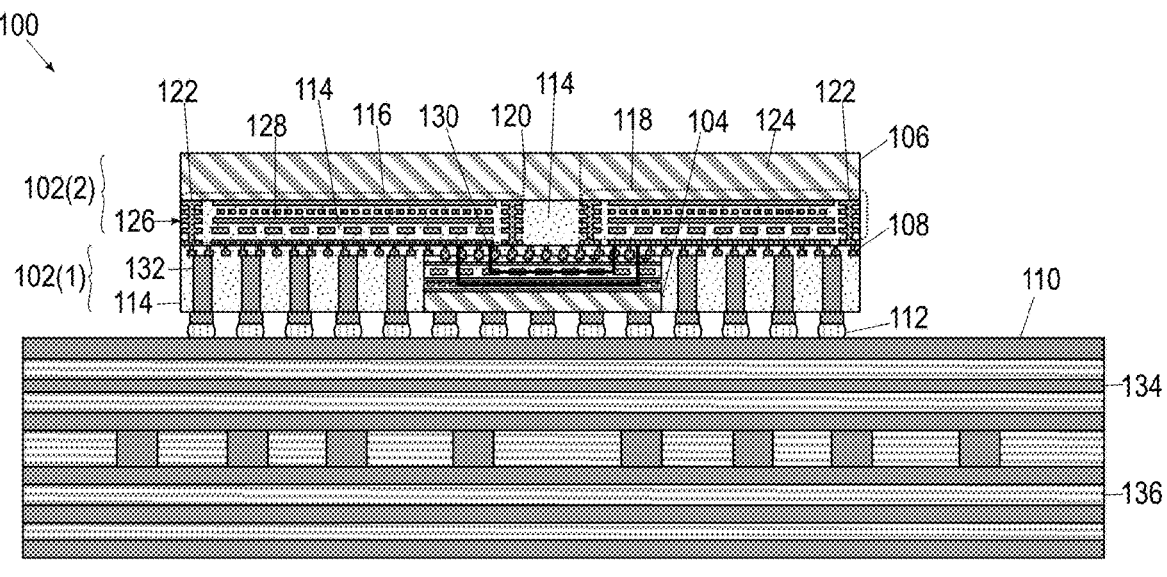
FIG. 1A
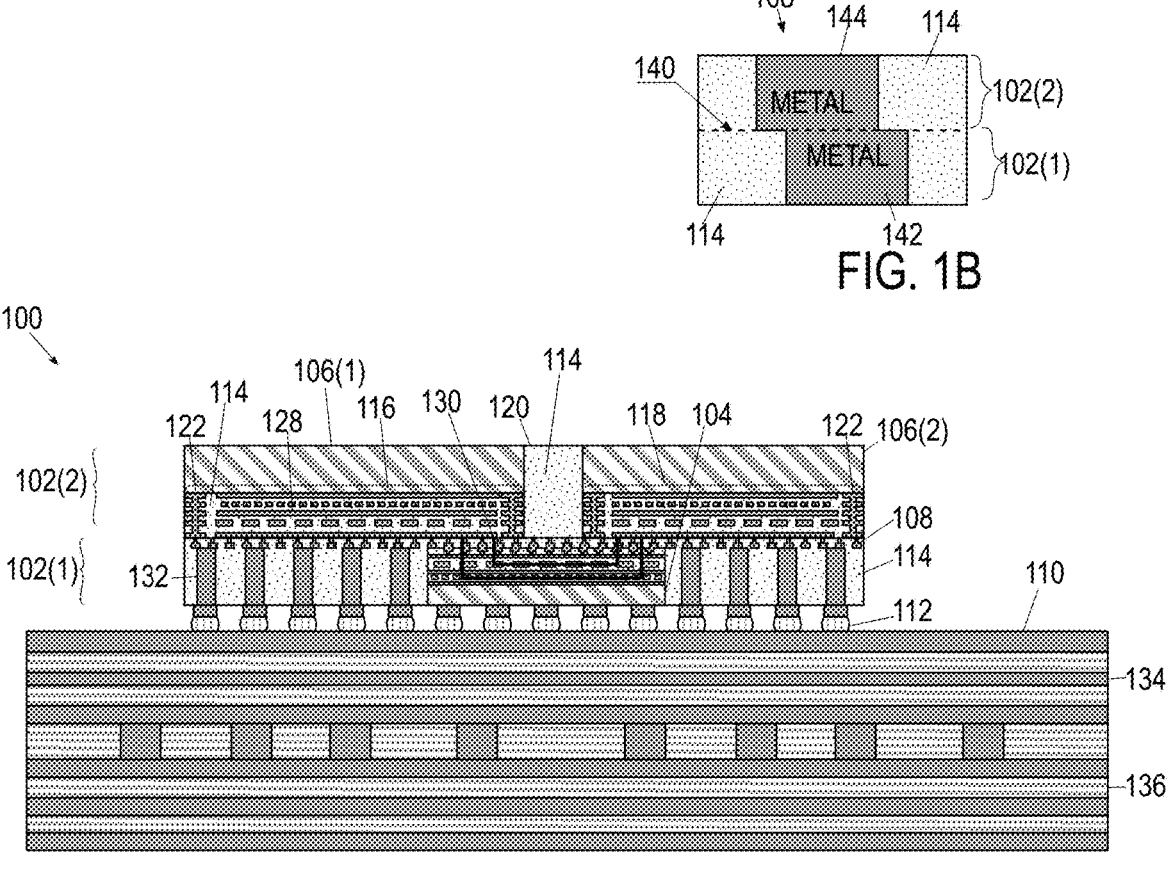
FIG. 1B
FIG. 2

PACKAGE ARCHITECTURE OF LARGE DIES USING QUASI-MONOLITHIC CHIP LAYERS

TECHNICAL FIELD

The present disclosure relates to techniques, methods, and apparatus directed to a package architecture of large dies using quasi-monolithic chip layers.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A is a schematic cross-sectional view of an example microelectronic assembly according to some embodiments of the present disclosure.

FIG. 1B is a schematic cross-sectional view of a portion of the example microelectronic assembly of FIG. 1A.

FIG. 2 is a schematic cross-sectional view of another example microelectronic assembly according to some embodiments of the present disclosure.

DETAILED DESCRIPTION

Overview

Figure 3:
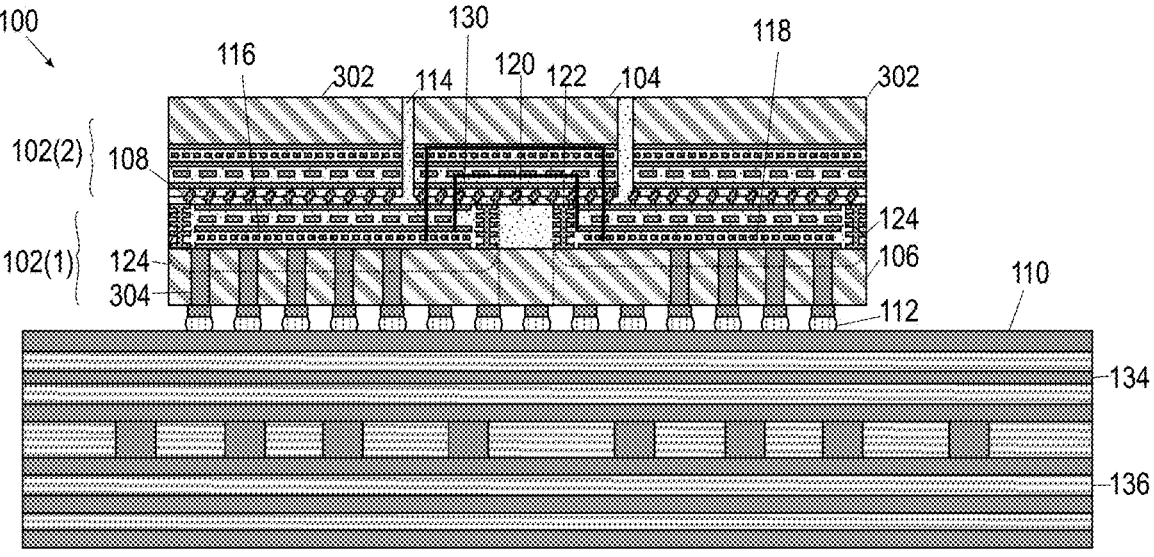
FIG. 3 is a schematic cross-sectional view of yet another example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

As Moore's law nears its natural limits, supercomputing faces inherent physical problems in moving toward zettascale systems. Zettascale computing aims to create 1000x the current level of compute today in or around the latter half of the decade, to take advantage of high demand for computational resources by both consumers and businesses, and to implement data hungry applications, such as artificial intelligence, machine learning and such. Zettascale supercomputers are targeted to have computing performance in the order of one zettaflops. One zettaflops equals one thousand exaflops, or one sextillion floating point operations per second. Despite advances in semiconductor processing and logic design that have permitted an increase in the amount of logic circuits that may be included in processors and other IC devices, signal speeds reach physics-based bottlenecks to achieve zettascale performance, for example, from the inherent limitations of the materials used for signal propagation, such as copper in a dielectric medium, heat transfer challenges from high intensity computations, and power delivery constraints to power several thousand simultaneous computations in multiple processors.

Many processors used in current supercomputers and other processing devices already have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer. Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

Consequently, the trend in the processor industry is to move toward disaggregation, using multiple known good chiplets (smaller sized IC dies) made using different manufacturing technologies and assembling them together into one microprocessor using novel bonding techniques. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SoC). In other words, the individual dies are connected to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a USB controller, which is built to meet certain universal serial bus (USB) standards, rather than for processing speed. Thus, by having different parts of the overall design separated into different dies, each one optimized in terms of design and manufacturing, the overall yield and cost of the combined die solution may be improved.

The connectivity between these dies is achievable by many ways. For example, in 2.5D packaging solutions, a silicon interposer and through-silicon vias (TSVs) connect dies at silicon interconnect speed in a minimal footprint. In another example, a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C2 interconnections). The bridge and the 3D stacked architecture may also be combined to allow for top-packaged chips to communicate with other chips horizontally using the bridge and vertically, using Through-Mold Vias (TMVs) which are typically larger than TSVs. However, these current interconnect technologies use solder or its equivalent for connectivity, with consequent low vertical and horizontal interconnect density. Such solder-based packaging architecture also suffers from higher power consumption compared to on-die interconnects, increased cost to support assembly at fine pitches, and no room for error in manufacturing.

In this regard, various IC dies manufactured using different processes may be integrated in hybrid bonding architectures such as quasi-monolithic hierarchically integrated packaging architecture, which represents an opportunity to further improve the performance of these architectures while utilize existing infrastructure and manufacturing capabilities. The quasi-monolithic hierarchically integrated packaging architecture includes recursively coupled plurality of IC dies in microelectronic assemblies of a processing system. The plurality of IC dies may comprise active dies and/or passive dies, and at least a portion of the plurality of dies are coupled using high density interconnects.

In addition, despite the trend toward disaggregation, having circuitry on a single wafer or large die may be advantageous in certain applications. For example, computing systems are continuously scaling to add more memory and processing resources to improve the performance per watt and overall performance (e.g., operating in the range of Tera flops per second). Yet, data transfer between compute and memory resources is a major bottleneck and limits the achievable performance using currently available computing systems. To address this issue, co-locating the processing and memory resources on the same IC die is advantageous, resulting in circuitry that occupies a large planar area. With advances in design and manufacture of semiconductor devices, it has become possible to integrate increasingly larger amounts of circuitry on a single die, with the result that today, the size of a die can easily approach the limits of existing manufacturing equipment. An example is circuitry that are approaching the limits of reticle sizes. Semiconductor manufacturing equipment that are designed to process silicon wafers divide each wafer into various reticles that are processed simultaneously. It is now possible to design and integrate so much circuitry on a die that the size of the circuitry may be as large or even larger than a reticle. There is therefore a need for solutions to the problems posed by circuitry sizes reaching the reticle limitations of semiconductor manufacturing equipment.

In addition, reticle stitching in a single monolithic wafer necessarily requires the same manufacturing technology for all dies within a wafer. In addition, manufacturing defects may affect the usability of the entire wafer in some scenarios. For example, all the dies on the wafer within a die complex (e.g., arrangement of circuitry and components) must work or the overall die complex must be discarded. Such issues can be addressed through redundancy and repair mechanisms, but at the expense of density and design complexity.

Accordingly, embodiments of a microelectronic assembly disclosed herein comprise a plurality of layers of IC dies, adjacent layers in the plurality of layers being coupled together by first interconnects having a pitch of less than 10 micrometers between adjacent first interconnects, and a package substrate coupled to the plurality of layers by second interconnects. A first layer in the plurality of layers comprises a dielectric material surrounding a first IC die in the first layer, a second layer in the plurality of layers is adjacent and non-coplanar with the first layer, the second layer comprises a first region and a second region separated by a third region, the first region and the second region are bounded by respective guard rings, and the first IC die comprises conductive pathways conductively coupling conductive traces in the first region with conductive traces in the second region.

Other embodiments include an IC package comprising a first layer and a second layer. The first layer comprises an IC die in a dielectric material, the second layer comprises a first circuit region and a second circuit region separated by the dielectric material, each of the first circuit region and the second circuit region encircled by a respective guard ring, the guard ring comprising a stack of conductive traces coupled by conductive vias. The IC package also includes a package substrate coupled to the first layer or the second layer. The first layer and the second layer are coupled by first interconnects having a pitch of less than 10 micrometers between adjacent first interconnects, the package substrate is coupled to the first layer or the second layer by second interconnects having pitch of more than 10 micrometers between adjacent interconnects, each of the first circuit region and the second circuit region have a footprint ranging approximately between 800 square millimeters to 860 square millimeters in area, and the first circuit region and the second circuit are conductively coupled by conductive pathways in the IC die of the first layer.

Embodiments also include a method comprising providing a first layer comprising IC dies surrounded by a dielectric material; coupling a second layer to the layer, the second layer comprising at least one IC die having a first circuit region and a second circuit region separated at least by the dielectric material, the first circuit region and the second circuit region being enclosed within a guard ring; and coupling a package substrate to the first layer or the second layer. The dielectric material comprises a compound of silicon and at least one of oxygen, nitrogen, and carbon. Coupling the second layer comprises forming metal-metal bonds with a pitch less than 10 micrometers between adjacent metal-metal bonds; and positioning the second layer over the first layer such that conductive pathways between the first circuit region and the second circuit region are through at least one IC die in the first layer.

Embodiments of the microelectronic assembly as disclosed herein provide system comprising multi-reticle-sized circuitry and up to wafer or panel scale compute systems that utilize quasi-monolithic chip (QMC) packaging architecture to enable monolithic performance but with disaggregation yield and flexibility. Embodiments as described herein can offer a scalable solution to enable cost-efficient wafer-level supercomputers with monolithic interconnect densities without the typical interconnect density or yield limitations of existing solutions. It is also scalable to stack wafers or stacked memory dies to further increase the performance and reduce data movement overheads. Various embodiments can enable stacked configurations also to support even higher compute capability.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a noncrystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
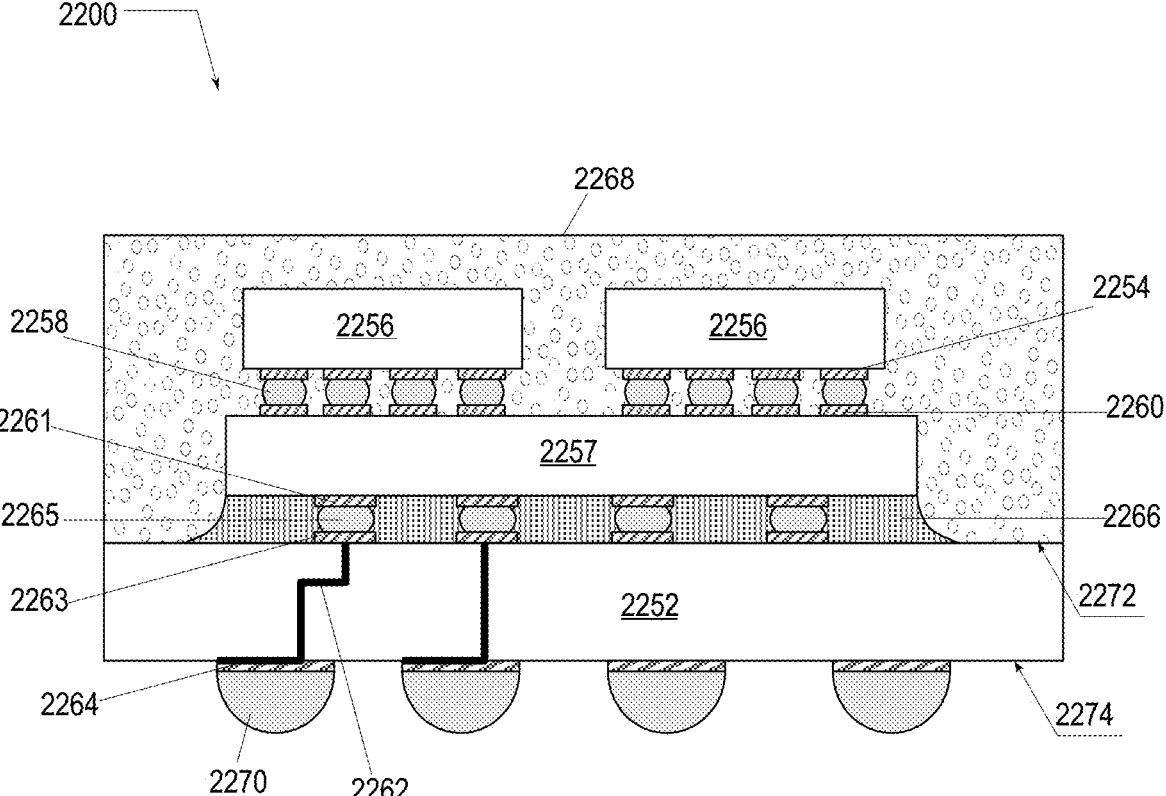
FIG. 10 is a cross-sectional view of a device package that includes one or more microelectronic assemblies in accordance with any of the embodiments disclosed herein.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a schematic cross-sectional view of an example microelectronic assembly 100 (plural "microelectronic assemblies 100") according to some embodiments of the present disclosure. Microelectronic assembly 100 comprises a plurality of layers 102 (e.g., 102(1), 102(2)) of IC dies 104 and 106 (e.g., IC die 104 in layer 102(1) and IC die 106 in layer 102(2)), adjacent layers 102 being coupled together by interconnects 108 having a pitch of less than 10 micrometers between adjacent first interconnects; and a package substrate 110 coupled to the plurality of layers 102 by interconnects (e.g., SLIs) 112. In the example shown in the figure, the number of layers 102 is two: a first layer 102(1) and a second layer 102(2). In various other embodiments, microelectronic assembly 100 may include two or greater number of layers 102. At least one layer 102 in microelectronic assembly 100 may comprise a dielectric material 114 surrounding one or more IC dies therein. For example, IC die 104 in layer 102(1) is surrounded by dielectric material 114. In various embodiments, dielectric material 114 comprises inorganic materials, for example, silicon oxide, silicon nitride, silicon carbide, and/or other forms of inorganic dielectric material typically used as interlayer dielectric (ILD) in semiconductor devices.

In various embodiments, IC die 106 is in layer 102(2) which is adjacent and non-coplanar with layer 102(1) comprising IC die 104. IC die 106 comprises circuit regions 116 and 118 separated by another circuit region 120. Circuit regions 116 and 118 are bounded by respective guard rings 122. Each guard ring 122 comprises one or more conductive traces in the shape of a rectangular or circular ring. In some embodiments, guard ring 122 may comprise continuous conductive traces (e.g., undivided ring); in other embodiments, guard ring 122 may comprise discontinuous conductive traces (e.g., divided ring). In embodiments with more than one conductive trace in guard ring 122, the various conductive traces are stacked one on top of another in layers of dielectric material 114 and coupled together by conductive vias. In some embodiments, more than one guard ring 122 may be provisioned around any one circuit region 116 or 118. In some embodiments, a different number of guard rings 122 may be present in different layers of dielectric material 114 (e.g., one layer may have one guard ring, and another layer may have two guard rings, and so forth).

Circuit regions 116 and 118 comprise, in addition to active circuit elements (e.g., transistors, diodes, etc.) conductive traces 128, and conductive vias (not shown so as not to clutter the drawings). In various embodiments, circuit regions 116 and 118 may comprise one or more circuitry configured for various functions (e.g., processing, memory storage, interconnections, power delivery, etc. such as Central Processing Unit (CPU), Graphics Processing Unit (GPU)), Static Random Access Memory (SRAM), Dynamic Random Access Memory (DRAM), high-bandwidth memory (HBM), input-output (10) including Peripheral Component Interconnect Express (PCIE), Double Data Rate (DDR) channels, voltage regulator (VR)).

In various embodiments, circuit regions 116 and 118 may each be the size of a standard reticle (e.g., a single layer of pattern that covers a small portion of a semiconductor wafer and used during photoimaging process to transfer circuit patterns into the semiconductor wafer), for example, 33 millimeters by 26 millimeters, or a footprint area of approximately between 800 square millimeters to 860 square millimeters. In other embodiments, circuit regions 116 and 118 are approximately between 30 millimeters and 40 millimeters along one edge and between 20 millimeters and 30 millimeters along an orthogonal edge. In many embodiments, any IC die 104 or 106 in microelectronic assembly 100 may not exceed 33 millimeters along the respective longest edge and 26 millimeters along an orthogonal edge, 33 mm×26 mm being the size of a reticle. In some embodiments, circuit regions 116 and 118 are approximately between 15 millimeters and 20 millimeters along one edge and between 20 millimeters and 30 millimeters along an orthogonal edge (e.g., corresponding to the size of half a reticle). In some other embodiments, circuit regions 116 and 118 are approximately between 15 millimeters and 20 millimeters along one edge and between 10 millimeters and 15 millimeters along an orthogonal edge (e.g., corresponding to the size of a quarter reticle).

In some embodiments, circuit region 120 may correspond to a region in a conventional semiconductor wafer between two adjacent IC dies, a region that is typically used for dicing and separating the two adjacent IC dies. For example, circuit region 120 may comprise a scribe street, metrology circuits and other structural features used during manufacturing and testing and not for functional operation of any IC die on the wafer. In other embodiments, circuit region 120 may correspond to a region in a conventional semiconductor wafer set aside for reticle stitching. In such embodiments, circuit region 120 may comprise areas of limited connectivity for "stitching" together different circuit regions, for example, to enable electrical continuity despite misalignment between two reticle lithography shots. Circuit region 120 may also comprise manufacturing monitoring structures such as parametric test and/or alignment metrology structures, which are not used during operation of circuits in circuit regions 116 and/or 118.

In various embodiments, IC die 106 may comprise a substrate 124, and a metallization stack 126. Metallization stack 126 comprises conductive traces 128 and conductive vias (not shown so as not to clutter the drawings) in dielectric material 114. In some embodiments, dielectric material 114 in metallization stack 126 may be of the same or similar composition as dielectric material 114 around IC die 104 in layer 102(1) (and other IC dies in the same or other layers in other embodiments). Conductive traces 128 may be of varying thicknesses within metallization stack 126; for example, some conductive traces 128 configured for power delivery may be thicker than other conductive traces 128 configured for signal transmission.

Active circuitry (not shown) including transistors and diodes may be provided in substrate 124 within circuit regions 116 and 118. Such active circuitry may be absent in some embodiments in circuit region 120. In various embodiments, circuit region 120 has fewer number of conductive traces 128 than circuit regions 116 or 118. In some embodiments, circuit region 120 may have no conductive traces 128 at all. In various embodiments, IC die 104 may be aligned with circuit region 120. For example, in the orientation shown in the figure, IC die 104 is directly below circuit region 120. In other embodiments, for example, where IC die 106 is below IC die 104, IC die 104 may be directly above circuit region 120. IC die 104 comprises conductive pathways 130 (shown as thick lines) conductively coupling conductive traces 128 in circuit region 116 and other conductive traces 128 in circuit region 118. Conductive pathways 130 may include interconnects 108 having a similar pitch as conductive traces 128 in circuit regions 116 and 118 such that there is no loss of interconnect density between circuit regions 116 and 118. In such embodiments, conductive pathways 130 may operate to achieve "reticle stitching" between circuit regions 116 and 118 that are each the size of a standard reticle without sacrificing interconnect density therebetween. Thus, unlike in conventional 2.5D packaging, where bridge dies provide conductive coupling between two separate IC dies but with reduced interconnect density (for example, due to solder-based FLIs of the bridge dies having a pitch greater than 10 micrometers between adjacent interconnects), embodiments of microelectronic assembly 100 can facilitate conductive coupling between circuit regions 116 and 118 (or between IC dies as described in reference to other figures) with substantially no loss of interconnect density and/or signal degradation.

IC die 104 may function as a "jump-over chiplet" (JoC) that uses high density routing to enable passive or active routing between two or more reticle-sized circuit regions 116 and 118. Such a configuration can enable a simpler option than conventional reticle stitching where circuit regions 116 and 118 are conductively coupled through circuit region 120 using whatever conductive traces are available), as well as the possibility to singulate smaller IC dies, offering an opportunity for yield recovery and/or supporting multiple product segments. IC die 104 utilizes high density vertical interconnect such as metal-to-metal bonding or hybrid bonding by interconnects 108. IC die 104 may use active or passive routing and may also incorporate its own repair/redundancy logic in addition to any additional repair/redundancy logic on IC die 106. In some embodiments, IC die 104 may also alleviate routing constraints on package substrate 110, for example, by reducing package routing for some D2D interconnects, or allowing low power domain package routing which could deliver power to IC die 106 through on-die thick conductive traces 128 in IC die 104. In some embodiments, through-dielectric vias (TDVs) 132 in dielectric material 114 around IC die 104 may enable conductive coupling directly between package substrate 110 and IC die 106, bypassing IC die 104 altogether.

In various embodiments, package substrate 110 may comprise conductive traces 134 and organic dielectric material 136. Examples of materials for organic dielectric material 136 are noted in the previous subsection. Note that conductive traces 134 are shown as disconnected rectangles in organic dielectric material 136, such is only for illustrative/schematic purposes and the shapes are not intended to be accurate representations of an actual package substrate. In addition, conductive vias, bond-pads, redistribution layers, substrate cores, passive components and other elements of package substrate 110 are not shown merely for ease of illustration and not as limitations. Package substrate 110 may be coupled to plurality of layers 102 by SLIs 112 (e.g., DTPS interconnects, such as flip-chip solder bonds). In various embodiments, SLI 112 may have a pitch greater than 10 micrometers between adjacent interconnects. In some embodiments, package substrate 110 may comprise a silicon or glass interposer. In some embodiments, instead of package substrate 110, an active die may be coupled to plurality of layers 102 forming a structure analogous to a conventional die stack.

FIG. 1B is a schematic cross-sectional view of one of interconnects 108 in example microelectronic assembly 100 of FIG. 1A. Note that although only interconnect 108 is shown, the same structure and description may apply to any other such interconnects comprising hybrid bonds in microelectronic assembly 100 where applicable. In a general sense, interconnect 108 may comprise, at an interface 140 between layers 102(1) and 102(2), metal-metal bonds between bond-pad 142 of layer 102(1) and bond-pad 144 of layer 102(2), and dielectric-dielectric bonds (e.g., oxide-oxide bonds) in dielectric materials 114 of layers 102(1) and 102(2). In some embodiments, the structures as illustrated in the figure may be present in an interface layer between layers 102(1) and 102(2). In other embodiments, the structures as illustrated in the figure may be present in IC dies 104 and 106 of the respective layers. In yet other embodiments, some structures as illustrated in the figure may be present in IC die 106, and other structures may be present outside/around IC die 104. Bond-pad 142 of layer 102(1) may bond with bond-pad 144 of layer 102(2). Dielectric material 114 (e.g., silicon oxide, silicon nitride, silicon oxynitride, etc.) in layers 102(1) and 102(2) may bond with each other. The bonded metal and dielectric materials form interconnect 108, comprising hybrid bonds, providing electrical and mechanical coupling between layers 102(1) and 102(2). In various embodiments, interconnects 108 may have a linear dimension of less than 5 micrometers and a pitch of less than 10 micrometers between adjacent interconnects.

FIG. 2 is a schematic cross-sectional view of another example microelectronic assembly 100 according to some embodiments of the present disclosure. The embodiment shown in the figure may be substantially similar to the embodiment of FIG. 1A, except that circuit regions 116 and 118 are provisioned in separate IC dies 106(1) and 106(2), respectively. Dielectric material 114 may fill any space between IC dies 106(1) and 106(2) in layer 102(2). Each one of IC dies 106(1) and 106(2) may have respective substrates 124 and metallization stacks 126 with conductive traces 128 therein. In some embodiments, IC dies 106(1) and 106(2) may be fabricated on a common monolithic wafer, then singulated, tested and reassembled in layer 102(2). Each of IC dies 106(1) and 106(2) may comprise respective guard ring 122 along a respective periphery. IC die 104 is in layer 102(1) between IC dies 106(1) and 106(2) and positioned to straddle the space (e.g., gap) between IC dies 106(1) and 106(2). In such embodiments, IC dies 106(1) and 106(2) may be reticle-sized, for example, having a footprint of 33 millimeters by 26 millimeters, or a footprint area of approximately between 800 square millimeters to 860 square millimeters. In other embodiments, IC dies 106(1) and 106(2) are approximately between 30 millimeters and 40 millimeters along one edge and between 20 millimeters and 30 millimeters along an orthogonal edge. In some other embodiments, IC dies 106(1) and 106(2) may be half a reticle sized, for example, having a footprint of 16 millimeters by 26 millimeters, or quarter sized, for example, having a footprint of 16 millimeters by 13.5 millimeters to accommodate multiple product segments, improve yield and various other advantages.

FIG. 3 is a schematic cross-sectional view of yet another example microelectronic assembly 100 according to some embodiments of the present disclosure. The embodiment shown in the figure may be substantially similar to the embodiment of FIG. 1A, except that IC die 104 is in layer 102(2) and IC die 106 is in layer 102(1). In addition, layer 102(2) comprises other IC dies 302 that may comprise circuits other than those in IC die 104. IC dies 302 may be separated from IC die 104 by dielectric material 114. Further, IC die 106 may comprise TSVs 304 through substrate 124. TSVs 304 may be absent in circuit region 120 in some embodiments. In other embodiments, TSVs 304 may be present in circuit region 120.

Figure 4:
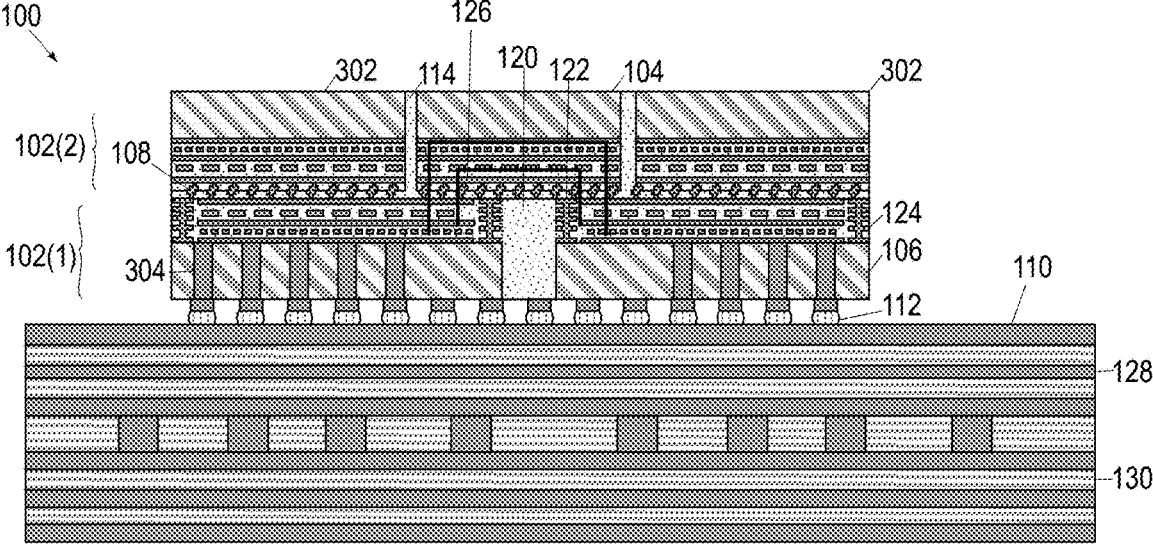
FIG. 4 is a schematic cross-sectional view of yet another example microelectronic assembly according to some embodiments of the present disclosure.

FIG. 4 is a schematic cross-sectional view of yet another example microelectronic assembly 100 according to some embodiments of the present disclosure. The embodiment shown in the figure may be substantially similar to the embodiment of FIG. 2, except that IC die 104 is in layer 102(2) and IC dies 106(1) and 106(2) are in layer 102(1). In addition, layer 102(2) comprises other IC dies 302 that may comprise circuits other than those in IC die 104. IC dies 302 may be separated from IC die 104 by dielectric material 114.

Figure 5:
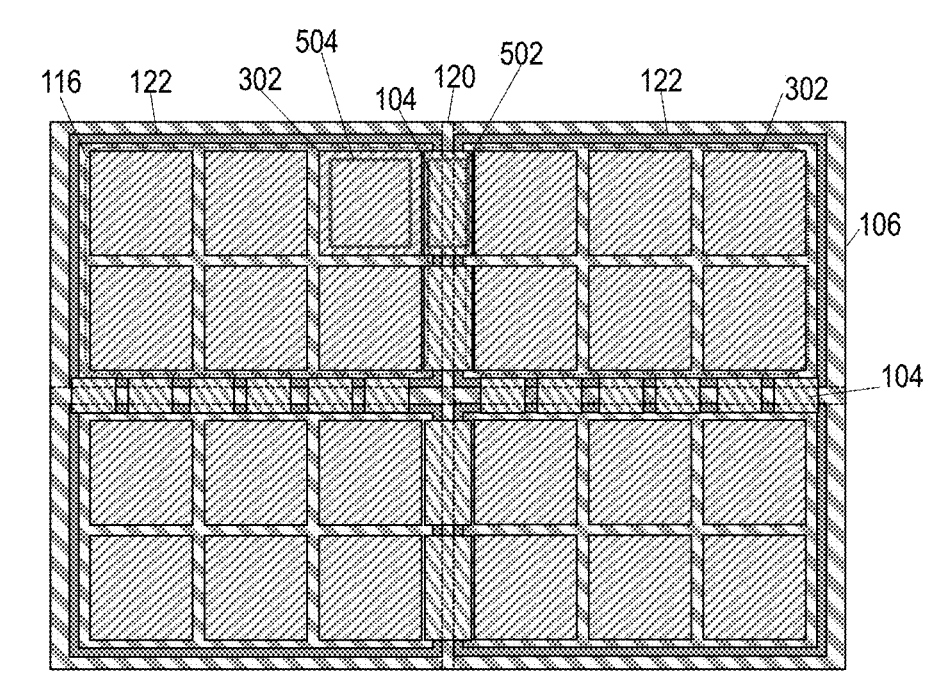
FIG. 5 is a schematic top view of yet another example microelectronic assembly according to some embodiments of the present disclosure.

FIG. 5 is a schematic top view of yet another example microelectronic assembly 100 according to some embodiments of the present disclosure. In some embodiments, a plurality of IC dies 104 may be provisioned in microelectronic assembly 100. The embodiment shown in the figure is similar to those of FIG. 3 or FIG. 1A. IC dies 302 may be arranged in an array over IC die 106. Respective guard rings 122 may separate circuit regions 116 and 118. One or more IC dies 104 may extend across circuit region 120 between guard rings 122 of circuit regions 116 and 118. In some embodiments, the aspect ratio, or the width (as compared to the length) of IC die 104 may be challenging to manufacture, handle, and/or assemble in microelectronic assembly 100. For example, IC die 104 is narrow enough to fit between circuit regions 116 and 118 and as long as circuit region 116 or 118. In embodiments where the space between circuit regions 116 and 118 is much smaller than respective lengths or widths, IC die 104 may be diced into smaller sizes having an aspect ratio more suitable for manufacturing, handling, and assembly. In the example embodiment shown, two IC dies 104 may be used to extend across circuit region 120 between circuit regions 116 and 118. In other embodiments, any number of IC dies 104 as may be suitable may be used appropriately to extend across circuit region 120. In some embodiments (not shown) conductive pathways may be provisioned diagonally across IC die 104, for example, to conductively couple circuit region 116 with proximate, non-parallel circuit region 118.

In various embodiments, IC dies 104 and 302 may each comprise respective guard rings 502 and 504 respectively. Guard rings 502 and 504 serve to structurally demarcate, contain, enclose, protect, etc. circuits and related structures within respective IC dies 104 and 302. Guard rings 502 and 504 may be like guard ring 122 structurally, comprising continuous conductive traces shaped as rectangular or circular rings in a plurality of layers and coupled together by conductive vias. In various embodiments, a plurality of IC dies 104 may be fabricated on a single monolithic wafer, each IC die 104 separated or demarcated from the others by respective guard rings 502; the wafer may later be diced into individual ones of IC dies 104, the dicing performed in the region between two adjacent guard rings 502. Similarly, a plurality of IC dies 302 may be fabricated on a single monolithic wafer, each IC die 302 separated or demarcated from the others by respective guard rings 504; the wafer may later be diced into individual ones of IC dies 302, the dicing performed in the region between two adjacent guard rings 504. Individual ones of IC dies 302 and 104 may be assembled in layer 102 appropriately.

Figure 6:
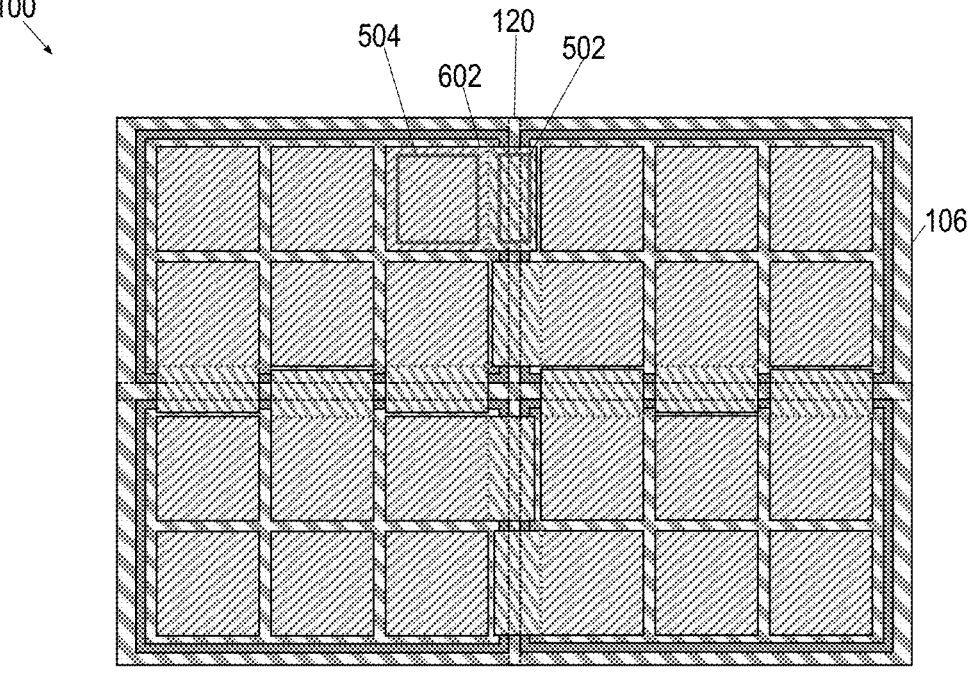
FIG. 6 is a schematic top view of yet another example microelectronic assembly according to some embodiments of the present disclosure.

FIG. 6 is a schematic top view of yet another example microelectronic assembly 100 according to some embodiments of the present disclosure. The embodiment shown in the figure is similar to the embodiment of FIG. 5 except that the circuits and related structures of at least one pair of IC dies 302 and 104 may be fabricated on a single IC die 602 such that IC dies 302 and 104 are laterally attached together in IC die 602. In some embodiments (as shown), the circuits and related structures of IC dies 302 and 104 may be demarcated (e.g., distinguished, separated, etc.) from each other by respective guard rings 504 and 502. In some such embodiments, IC dies 302 and 104 may be fabricated together and adjacent to each other on a single wafer, then diced in such a way that pairs of adjacent IC dies 302 and 104 are structurally together in IC die 602. In such embodiments, the space between guard rings 502 and 504 in IC die 602 may include a saw street, metrology structures, etc. because they have not been cut away in a dicing operation. In some embodiments, such IC dies 602 may be used proximate to circuit region 120 such that the circuits and related structures within guard ring 502 corresponding to IC die 104 are aligned with circuit region 120. In other embodiments, the circuits and related structures of IC dies 302 and 104 may not be demarcated from each other by any guard ring. In some such embodiments too, such IC dies 602 may be used proximate to circuit region 120 such that the circuits and related structures corresponding to IC die 104 are aligned with circuit region 120.

Figure 7:
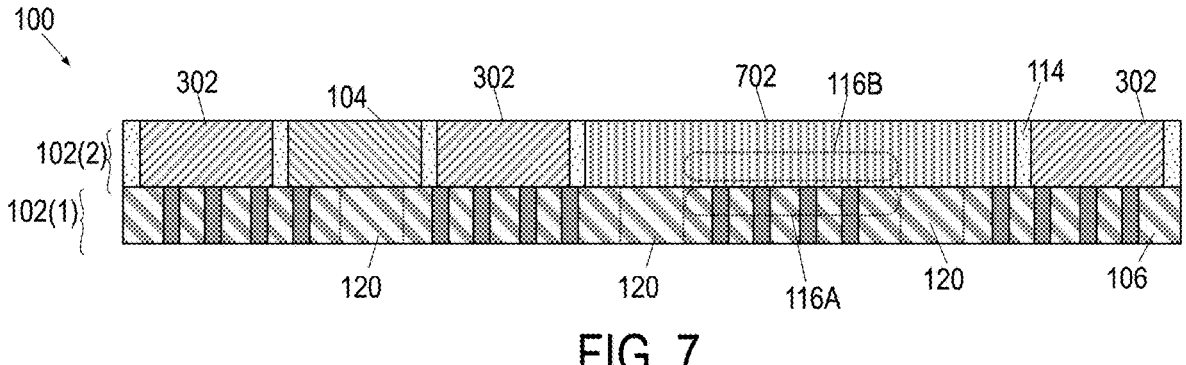
FIG. 7 is a schematic cross-sectional view of yet another example microelectronic assembly according to some embodiments of the present disclosure.

FIG. 7 is a schematic cross-sectional view of yet another example microelectronic assembly 100 according to some embodiments of the present disclosure. In some embodiments, IC die 106 comprises a large monolithic wafer with multiple reticle-sized circuit regions. In some such embodiments, a particular circuit region, for example, 116A in IC die 106 may not be functional. In such scenarios, IC die 702 may be assembled over circuit region 116A. IC die 702 may comprise circuit region 116B that is a functional replica of circuit region 116A, in addition to conductive pathways 130 etc. that are in IC die 104. In other words, IC die 702 may provide functional capabilities and include suitable circuits and structures configured to provide the functions of circuit region 116B and IC die 104. Conductive pathways 130 in IC die 702 may include in addition to structures as in IC die 104, additional repeaters etc., to enable analogous signal quality as in conductive pathways 130 in IC die 104.

Figure 8:
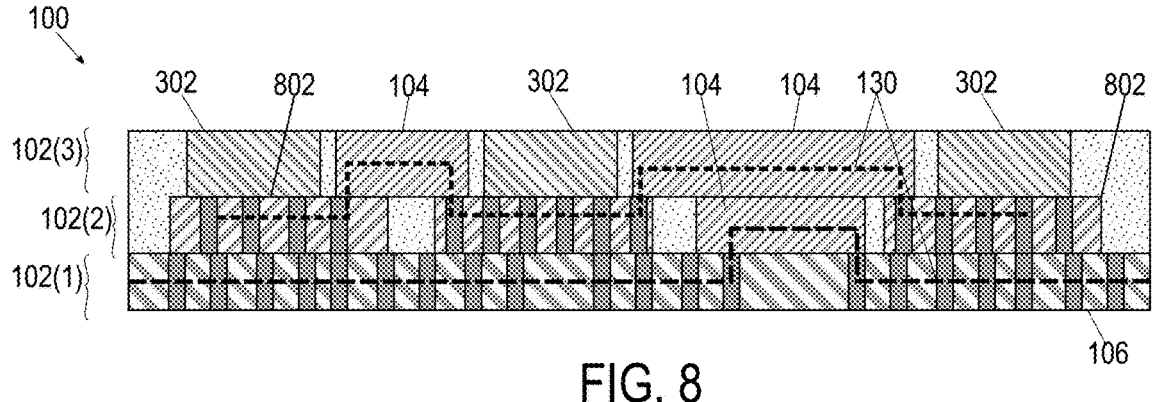
FIG. 8 is a schematic cross-sectional view of yet another example microelectronic assembly according to some embodiments of the present disclosure.

FIG. 8 is a schematic cross-sectional view of yet another example microelectronic assembly 100 according to some embodiments of the present disclosure. In various embodiments, circuit regions in any one layer 102 may be separated from each other because they are in separate IC dies or they are enclosed by guard rings within the same IC die. In such embodiments, the structurally separated circuit regions may be conductively coupled by conductive pathways 130 in an adjacent layer 102. For example, separated circuit regions in IC die 106 of layer 102(1) may be conductively coupled by conductive pathways 130 through IC dies 104 in layer 102(2); likewise, separated circuit regions in separated IC dies 802 in layer 102(2) may be conductively coupled by conductive pathways 130 through IC dies 104 in layer 102(3) and so on. Note that various circuit regions are not labeled so as not to clutter the drawing. It may be understood that reference to any circuit region is to be construed as described in FIG. 1A, for example, and other figures as appropriate. In an example embodiment, the different layers 102 may comprise IC dies having compute circuits, so that additional compute capabilities may be provisioned in microelectronic assembly 100 than is possible with a single layer of IC dies having compute circuits. Further, such a configuration as in the embodiment described herein can also enable planar connectivity, for example, between IC dies in any one layer, providing more interconnection configurations than in a simple stack of IC dies one on top of another.

In various embodiments, any of the features discussed with reference to any of FIGS. 1-8 herein may be combined with any other features to form a package with one or more IC dies as described herein, for example, to form a modified IC die 106, 602, etc. or a modified microelectronic assembly 100. Some such combinations are described above, but, in various embodiments, further combinations and modifications are possible. Further, the various embodiments described in any of FIGS. 1-8 herein may be combined suitably based on particular needs within the broad scope of the embodiments.

Example Methods

Figure 9:
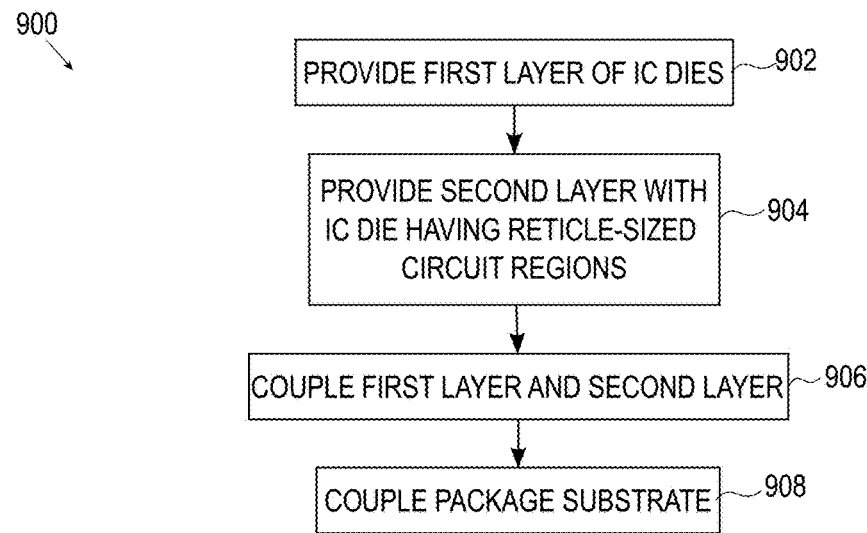
FIG. 9 is a schematic flow diagram listing example operations that may be associated with fabricating a microelectronic assembly according to some embodiments of the present disclosure.

FIG. 9 is a schematic flow diagram illustrating example operations 900 that may be associated with embodiments of methods to fabricate microelectronic assembly 100. At 902, a first layer 102(1) of IC dies for example, 104 (and 302 in some embodiments) may be provided. In various embodiments, first layer 102(1) may comprise a reconstituted wafer (or panel) comprising the IC dies separated by dielectric material 114. In some embodiments, TDVs 132 may also be provisioned in dielectric material 114. At 904, a second layer 102(2) having one or more IC dies 106 comprising reticle-sized circuit regions 116 and 118 (and other similarly sized circuit regions) may be provided. In some embodiments, second layer 102(2) may comprise a monolithic wafer. In some other embodiments, second layer 102(2) may comprise a monolithic panel. In yet other embodiments, second layer 102(2) may comprise a reconstituted wafer (or panel)

comprising a plurality of IC dies 106 separated by dielectric material 114. At 906, first layer 102(1) and second layer 102(2) may be coupled. The coupling may comprise forming hybrid metal-metal bonds and dielectric-dielectric bonds of interconnects 108 and positioning second layer 102(2) over (or under) first layer 102(1) such that conductive pathways 130 are through at least one IC die 104 in first layer 102(1). At 908, either first layer 102(1) or second layer 102(2) may be coupled to package substrate 110. In some embodiments, coupling the plurality of layers may be repeated for more than two layers until a desired stack is obtained. The stack of layers may then be coupled to package substrate 110.

Although FIG. 9 illustrates various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIG. 9 may be modified in accordance with the present disclosure to fabricate others of microelectronic package 100 disclosed herein. Although various operations are illustrated in FIG. 9 once each, the operations may be repeated as often as desired. For example, one or more operations may be performed in parallel to manufacture and test multiple microelectronic packages substantially simultaneously. In another example, the operations may be performed in a different order to reflect the structure of a particular microelectronic package in which one or more substrates or other components as described herein may be included.

Furthermore, the operations illustrated in FIG. 9 may be combined or may include more details than described. For example, the operations may be modified suitably without departing from the scope of the disclosure for IC dies 104, 106, 302, etc. that do not have a semiconductor substrate, but rather, are fabricated on other materials, such as glass or ceramic materials. Still further, the various operations shown and described may further include other manufacturing operations related to fabrication of other components of the microelectronic assemblies described herein, or any devices that may include the microelectronic assemblies as described herein. For example, the operations not shown in FIG. 9 may include various cleaning operations, additional surface planarization operations, operations for surface roughening, operations to include barrier and/or adhesion layers as desired, and/or operations for incorporating microelectronic packages as described herein in, or with, an IC component, a computing device, or any desired structure or device.

Example Devices and Components

Figure 11:
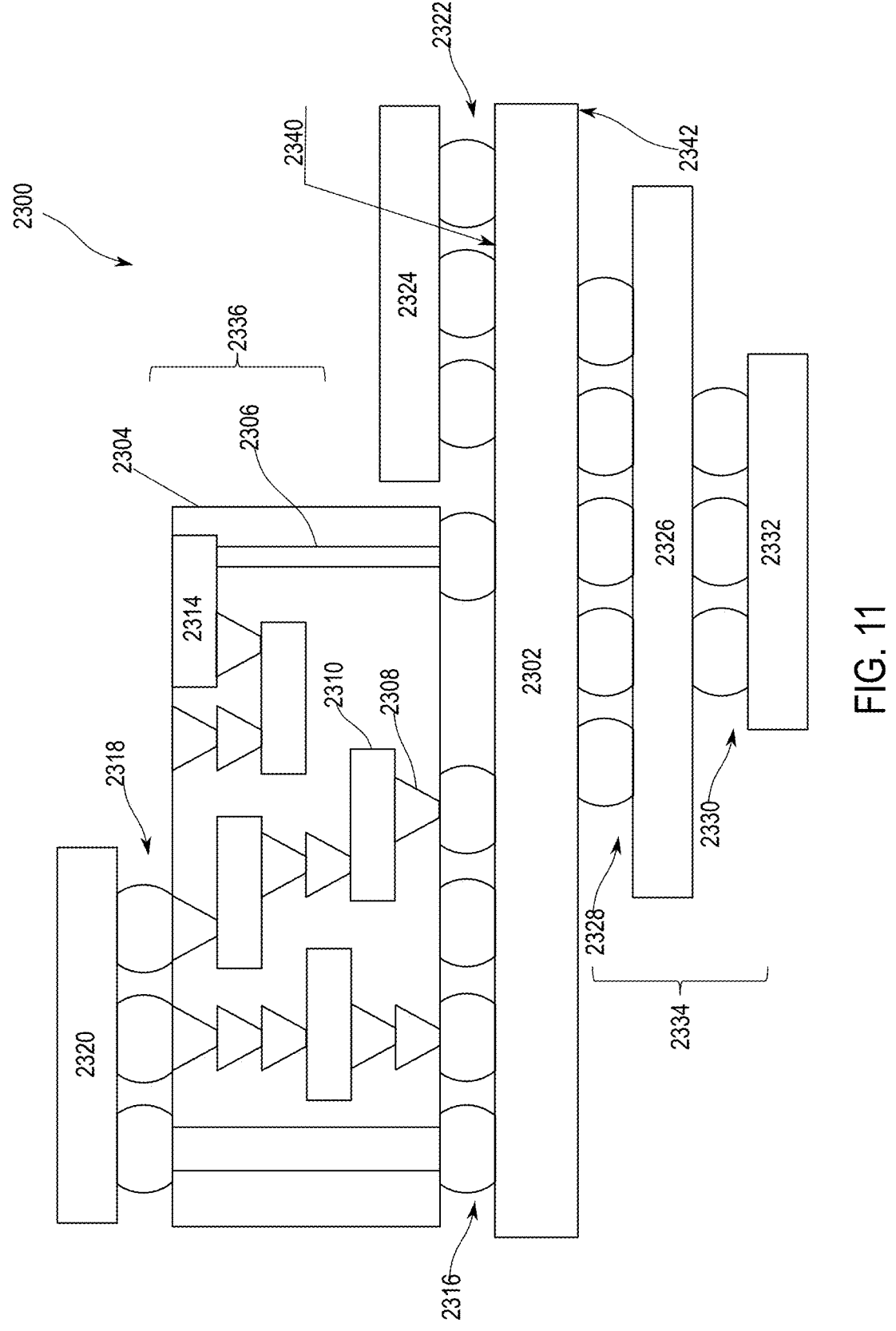
FIG. 11 is a cross-sectional side view of a device assembly that includes one or more microelectronic assemblies in accordance with any of the embodiments disclosed herein.
Figure 12:
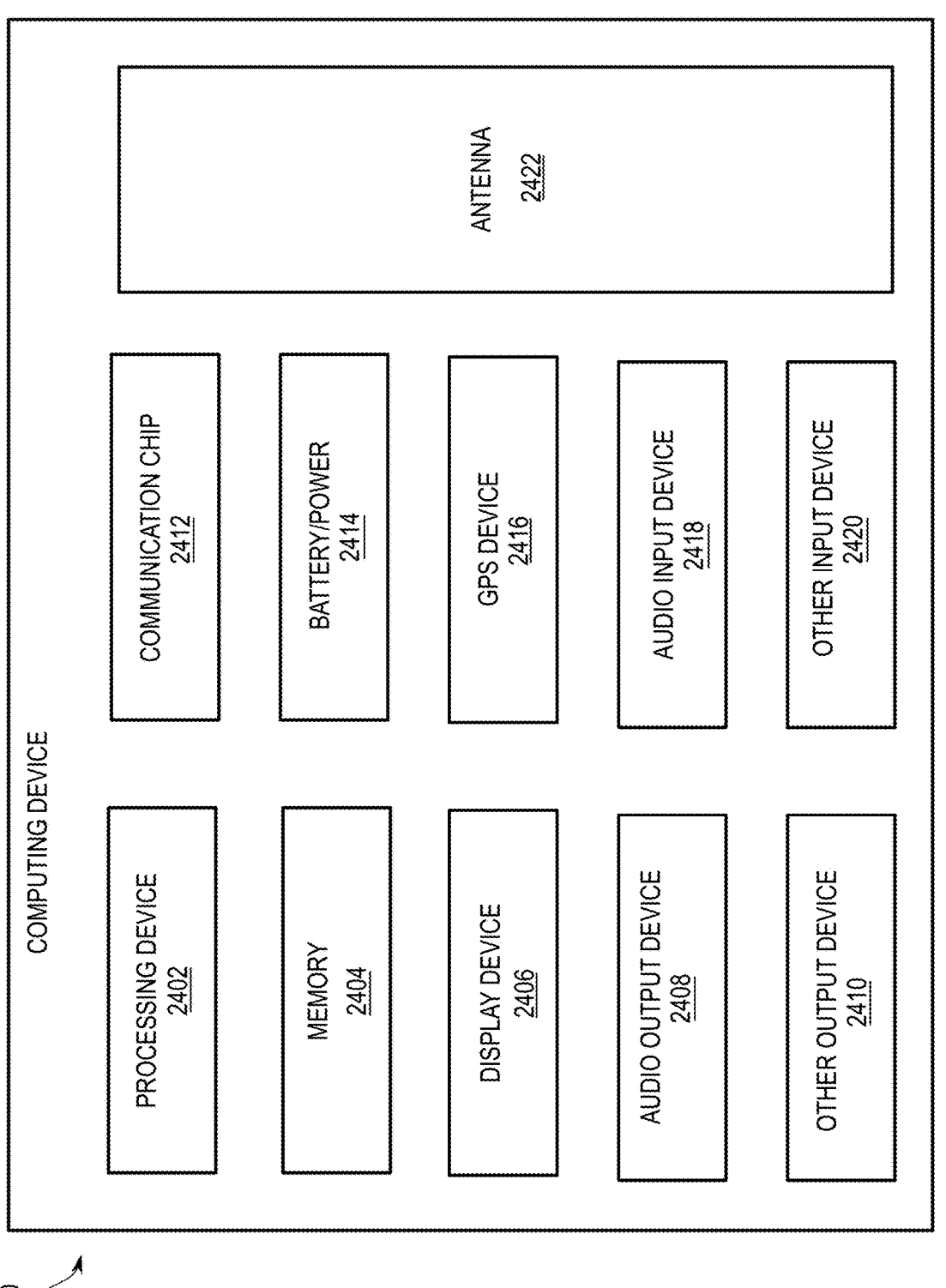
FIG. 12 is a block diagram of an example computing device that includes one or more microelectronic assemblies in accordance with any of the embodiments disclosed herein.

The packages disclosed herein, e.g., any of the embodiments shown in FIGS. 1-9 or any further embodiments described herein, may be included in any suitable electronic component. FIGS. 10-12 illustrate various examples of packages, assemblies, and devices that may be used with or include any of the IC packages as disclosed herein.

FIG. 10 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 11.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 11 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 10.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 10. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 12 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 10). In yet another example, any one or more of the components of computing device 2400 may include an IC device assembly 2300 (e.g., as shown in FIG. 11).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SoC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, crypto-processors (specialized processors that execute cryptographic algorithms within hardware), server processors, or any other suitable processing devices. Computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded DRAM (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above).

GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

Example 1 provides a microelectronic assembly (e.g., 100, FIG. 1), comprising: a plurality of layers (e.g., 102) of IC dies (e.g., 104, 106), adjacent layers in the plurality of layers being coupled together by first interconnects (e.g., 108) having a pitch of less than 10 micrometers between adjacent first interconnects; and a package substrate (e.g., 110) coupled to the plurality of layers by second interconnects (e.g., 112), in which: a first layer (e.g., 102(1)) in the plurality of layers comprises a dielectric material (e.g., 114) surrounding a first IC die (e.g., 104) in the first layer, a second layer in the plurality of layers is adjacent and non-coplanar with the first layer, the second layer (e.g., 102(2)) comprises a first circuit region (e.g., 116) and a second circuit region (e.g., 118) separated by a third circuit region (e.g., 120), the first circuit region and the second circuit region are bounded by respective guard rings (e.g., 122), and the first IC die comprises conductive pathways (e.g., 130) conductively coupling conductive traces (e.g., 128) in the first circuit region with conductive traces in the second circuit region.

Example 2 provides the microelectronic assembly of example 1, in which the first interconnects comprise metal-metal bonds and dielectric-dielectric bonds.

Example 3 provides the microelectronic assembly of any one of examples 1-2, in which the third circuit region has fewer number of conductive traces than the first circuit region and the second circuit region.

Example 4 provides the microelectronic assembly of any one of examples 1-3, in which the first circuit region and the second circuit region are approximately between 30 millimeters and 40 millimeters along one edge and between 20 millimeters and 30 millimeters along an orthogonal edge.

Example 5 provides the microelectronic assembly of any one of examples 1-3, in which the first circuit region and the second circuit region are approximately between 15 millimeters and 20 millimeters along one edge and between 20 millimeters and 30 millimeters along an orthogonal edge.

Example 6 provides the microelectronic assembly of any one of examples 1-3, in which the first circuit region and the second circuit region are approximately between 15 milli-meters and 20 millimeters along one edge and between 10 millimeters and 15 millimeters along an orthogonal edge.

Example 7 provides the microelectronic assembly of any one of examples 1-6, in which the dielectric material com-prises a compound of silicon and at least one of oxygen, nitrogen or carbon.

Example 8 provides the microelectronic assembly of any one of examples 1-7, in which through-dielectric vias (TDVs) (e.g., 132) are in the dielectric material in the first layer.

Example 9 provides the microelectronic assembly of any one of examples 1-8, in which the package substrate com-prises conductive traces (e.g., 134) in layers of an organic dielectric material (e.g., 136), the organic dielectric material being different from the dielectric material.

Example 10 provides the microelectronic assembly of any one of examples 1-9, in which the second interconnects have a pitch greater than 10 micrometers between adjacent inter-connects.

Example 11 provides the microelectronic assembly of any one of examples 1-10, in which: the first circuit region, the second circuit region and the third circuit region comprise respective substrates (e.g., 124) and respective metallization stacks (e.g., 126), and the respective metallization stacks comprise the dielectric material, the respective conductive traces and the respective guard rings.

Example 12 provides the microelectronic assembly of example 11, in which each guard ring comprises a stack of ring-shaped conductive traces in the metallization stack.

Example 13 provides the microelectronic assembly of any one of examples 1-12, in which the first circuit region, the second circuit region and the third circuit region are in a second IC die in the second layer.

Example 14 provides the microelectronic assembly of any one of examples 1-12, in which (e.g., FIG. 2): the second layer further comprises a second IC die and a third IC die adjacent to the second IC die, the third IC die separated from the second IC die by the dielectric material, the first IC die extends across adjacent sides of the second IC die and the third IC die, and the first circuit region and the second circuit region are in separate ones of the second IC die and the third IC die.

Example 15 provides the microelectronic assembly of example 14, in which the third circuit region does not comprise any conductive traces.

Example 16 provides the microelectronic assembly of any one of examples 1-15, in which the first layer is coupled to the package substrate by the second interconnects.

Example 17 provides the microelectronic assembly of any one of examples 1-13, in which: at least one layer comprises a plurality of IC dies (e.g., 302) surrounded by the dielectric material, and adjacent IC dies in the plurality of IC dies are separated by the dielectric material.

Example 18 provides the microelectronic assembly of example 17, in which (e.g., FIG. 8): separate layers comprise separate pluralities of IC dies, portions of conductive path-ways between any two IC dies in any one layer are through at least one IC die in an adjacent non-coplanar layer.

Example 19 provides the microelectronic assembly of any one of examples 1-18, in which (e.g., FIG. 3) the second layer is coupled to the package substrate by the second interconnects.

Example 20 provides the microelectronic assembly of example 19, in which the first circuit region, the second circuit region and the third circuit region are in a second IC die in the second layer, and the second IC die comprises TSVs (e.g., 304).

Example 21 provides the microelectronic assembly of any one of examples 19-20, in which: the first layer further comprises a plurality of IC dies (e.g., 302) surrounded by the dielectric material, and adjacent IC dies in the plurality of IC dies are separated by the dielectric material.

Example 22 provides the microelectronic assembly of example 21, in which (e.g., FIG. 4): the second layer further comprises a plurality of IC dies surrounded by the dielectric material, the first IC die extends across adjacent sides of at least two IC dies in the second layer, and the first circuit region and the second circuit region are in separate ones of the at least two IC dies.

Example 23 provides the microelectronic assembly of any one of examples 21-22, in which (e.g., FIG. 5) the plurality of IC dies is arranged in an array.

Example 24 provides the microelectronic assembly of any one of examples 21-23, in which: the first IC die comprises a first guard ring enclosing first structures of the first IC die, the first structures include the conductive pathways, IC dies in the plurality of IC dies comprise respective second guard rings enclosing second structures of the IC dies.

Example 25 provides the microelectronic assembly of example 24, in which (e.g., FIG. 6): at least one IC die (e.g., 602) in the plurality of IC dies comprises the first structures enclosed by the first guard ring and the second structures enclosed by the second guard ring, and the conductive pathways in the first structures are aligned with the third circuit region of the second IC die in the second layer.

Example 26 provides the microelectronic assembly of any one of examples 24-25, in which (e.g., FIG. 6) the first IC die and an adjacent one of the plurality of IC dies are laterally attached together.

Example 27 provides the microelectronic assembly of example 21, in which (e.g., FIG. 7) the first IC die further comprises circuit elements that are functional replicas of circuit elements in a portion of the second IC die.

Example 28 provides the microelectronic assembly of any one of examples 1-27, in which the first IC die is coupled front-to-front with the second IC die.

Example 29 provides an IC package, comprising: a first layer (e.g., 102(1)) comprising an IC die (e.g., 104) in a dielectric material (e.g., 114); a second layer (e.g., 102(2)) comprising a first circuit region (e.g., 116) and a second circuit region (e.g., 118) separated by the dielectric material, each of the first circuit region and the second circuit region encircled by a respective guard ring (e.g., 122), the guard ring comprising a stack of conductive traces coupled by conductive vias; and a package substrate (e.g., 110) coupled to the first layer or the second layer; in which: the first layer and the second layer are coupled by first interconnects (e.g., 108) having a pitch of less than 10 micrometers between adjacent first interconnects, the package substrate is coupled to the first layer or the second layer by second interconnects (e.g., 112) having pitch of more than 10 micrometers between adjacent interconnects, each of the first circuit region and the second circuit region have a footprint ranging approximately between 800 square millimeters to 860 square millimeters in area, and the first circuit region and the second circuit region are conductively coupled by conduc-tive pathways (e.g., 130) in the IC die of the first layer.

Example 30 provides the IC package of example 29, in which (e.g., FIG. 1): the package substrate is coupled to the first layer, the IC die is a first IC die, and the first circuit region and the second circuit region are in a second IC die (e.g., 106) in the second layer.

Example 31 provides the IC package of example 29, in which (e.g., FIG. 2): the package substrate is coupled to the second layer, and the first circuit region and the second circuit region are in separate IC dies (e.g., 106) in the second layer.

Example 32 provides the IC package of example 29, in which: the package substrate is coupled to the second layer, and the first layer comprises a plurality of other IC dies (e.g., 302).

Example 33 provides the IC package of example 32, in which (e.g., FIG. 3): the IC die is a first IC die, and the first circuit region and the second circuit region are in a second IC die (e.g., 106) in the second layer.

Example 34 provides the IC package of example 32, in which (e.g., FIG. 4) the first circuit region and the second circuit region are in separate IC dies (e.g., 106) in the second layer.

Example 35 provides the IC package of any one of examples 32-34, in which (e.g., FIG. 5) the plurality of other IC dies is arranged in an array in the first layer.

Example 36 provides the IC package of any one of examples 32-35, in which (e.g., FIG. 6) the first IC die and an adjacent one of the other IC dies are laterally attached together.

Example 37 provides the IC package of example 29, in which (e.g., FIG. 7): one of the first circuit regions and the second circuit regions is defective, and the first IC die comprises a non-defective counterpart of the defective one of the first circuit region and the second circuit region.

Example 38 provides the IC package of example 29, further comprising (e.g., FIG. 8) a third layer comprising a plurality of IC dies in the dielectric material, in which: conductive pathways between adjacent circuit regions enclosed by guard rings in the first layer are through IC dies in the second layer, and conductive pathways between adjacent circuit regions enclosed by guard rings in the second layer are through IC dies in the third layer.

Example 39 provides a method, comprising: providing a first layer comprising IC dies surrounded by a dielectric material; coupling a second layer to the first layer, the second layer comprising at least one IC die having a first circuit region and a second circuit region separated at least by the dielectric material, the first circuit region and the second circuit region being enclosed within a guard ring; and coupling a package substrate to the first layer or the second layer, in which: the dielectric material comprises a compound of silicon and at least one of oxygen, nitrogen and carbon, and coupling the second layer comprises: forming metal-metal bonds with a pitch less than 10 micrometers between adjacent metal-metal bonds; and positioning the second layer over the first layer such that conductive pathways between the first circuit region and the second circuit region are through at least one IC die in the first layer.

Example 40 provides the method of example 39, in which: the first circuit region and the second circuit region each have respective rectangular footprints that are approximately 33 millimeters by 26 millimeters.

Example 41 provides the method of any one of examples 39-40, in which: the metal-metal bonds are surrounded by dielectric-dielectric bonds between the dielectric material of the first layer and the second layer.

Example 42 provides the method of any one of examples 39-41, in which: coupling the package substrate comprises forming interconnects with a pitch greater than 10 micrometers between adjacent interconnects.

Example 43 provides the method of any one of examples 39-42, in which: the first layer and the second layer comprise at least one of a wafer or a panel.

Example 44 provides the method of any one of examples 39-43, further comprising repeating coupling layers until a desired stack of layers is obtained.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
a plurality of layers of IC dies, adjacent layers in the plurality of layers being coupled together by first interconnects having a pitch of less than 10 micrometers between adjacent first interconnects; and
a package substrate coupled with the plurality of layers by second interconnects,
wherein:
a first layer in the plurality of layers comprises a dielectric material surrounding a first IC die in the first layer,
a second layer in the plurality of layers is adjacent and non-coplanar with the first layer,
the second layer comprises a first circuit region and a second circuit region separated by a third circuit region,
the first circuit region and the second circuit region are bounded by respective guard rings, and
the first IC die comprises conductive pathways conductively coupling conductive traces in the first circuit region with conductive traces in the second circuit region.

2. The microelectronic assembly of claim 1, wherein:
the first interconnects comprise metal-metal bonds and dielectric-dielectric bonds, and
the dielectric material comprises a compound of silicon and at least one of oxygen, nitrogen or carbon.

3. The microelectronic assembly of claim 1, wherein the third circuit region has fewer number of conductive traces than the first circuit region and the second circuit region.

4. The microelectronic assembly of claim 1, wherein the first circuit region and the second circuit region are approximately between 30 millimeters and 40 millimeters along one edge and between 20 millimeters and 30 millimeters along an orthogonal edge.

5. The microelectronic assembly of claim 1, wherein:
the second layer further comprises a second IC die and a third IC die adjacent to the second IC die, the third IC die separated from the second IC die by the dielectric material,
the first IC die extends across adjacent sides of the second IC die and the third IC die, and
the first circuit region and the second circuit region are in separate ones of the second IC die and the third IC die.

6. The microelectronic assembly of claim 1, wherein the first circuit region, the second circuit region and the third circuit region are in a second IC die in the second layer.

7. The microelectronic assembly of claim 6, wherein:
the second layer is coupled with the package substrate by the second interconnects, the second IC die in the second layer comprises through-substrate vias (TSVs).

8. The microelectronic assembly of claim 7, wherein:

the first layer further comprises a plurality of IC dies surrounded by the dielectric material, adjacent IC dies in the plurality of IC dies are separated by the dielectric material, the second layer further comprises a plurality of IC dies surrounded by the dielectric material, the first IC die extends across adjacent sides of at least two IC dies in the second layer, and the first circuit region and the second circuit region are in different IC dies of the at least two IC dies.

9. The microelectronic assembly of claim 8, wherein the first IC die and an adjacent one of the plurality of IC dies are laterally attached together.

10. An IC package, comprising:

a first layer comprising an IC die in a dielectric material;

a second layer comprising a first circuit region and a second circuit region separated by the dielectric material, each of the first circuit region and the second circuit region encircled by a respective guard ring, the guard ring comprising a stack of conductive traces coupled by conductive vias; and a package substrate coupled with the first layer or the second layer;

wherein:

the first layer and the second layer are coupled by first interconnects having a pitch of less than 10 micrometers between adjacent first interconnects, the package substrate is coupled with the first layer or the second layer by second interconnects having pitch of more than 10 micrometers between adjacent interconnects, each of the first circuit region and the second circuit region have a footprint ranging approximately between 800 square millimeters to 860 square millimeters in area, and the first circuit region and the second circuit region are conductively coupled by conductive pathways in the IC die of the first layer.

11. The IC package of claim 10, wherein:

the package substrate is coupled with the first layer, the IC die is a first IC die, and the first circuit region and the second circuit region are in a second IC die in the second layer.

12. The IC package of claim 10, wherein:

the package substrate is coupled with the second layer, and the first circuit region and the second circuit region are in separate IC dies in the second layer.

13. The IC package of claim 10, wherein:

the package substrate is coupled with the second layer, and the first layer comprises a plurality of other IC dies.

14. The IC package of claim 13, wherein:

the IC die is a first IC die, and the first circuit region and the second circuit region are in a second IC die in the second layer.

15. The IC package of claim 13, wherein the first circuit region and the second circuit region are in separate IC dies in the second layer.

16. The IC package of claim 13, wherein the IC die and an adjacent one of the other IC dies are laterally attached together.

17. A method, comprising:

providing a first layer comprising IC dies surrounded by a dielectric material;

coupling a second layer to the first layer, the second layer comprising at least one IC die having a first circuit region and a second circuit region separated at least by the dielectric material, the first circuit region and the second circuit region being enclosed within a guard ring; and coupling a package substrate to the first layer or the second layer, wherein:

the dielectric material comprises a compound of silicon and at least one of oxygen, nitrogen and carbon, and coupling the second layer comprises:

forming metal-metal bonds with a pitch less than 10 micrometers between adjacent metal-metal bonds; and positioning the second layer over the first layer such that conductive pathways between the first circuit region and the second circuit region are through at least one IC die in the first layer.

18. The method of claim 17, wherein: the first circuit region and the second circuit region each have respective rectangular footprints that are approximately 33 millimeters by 26 millimeters.

19. The method of claim 17, wherein: the first layer and the second layer comprise at least one of a wafer or a panel.

20. The method of claim 17, further comprising repeating coupling layers until a desired stack of layers is obtained.

* * * * *